United States Patent
Chen et al.

(10) Patent No.: US 10,734,770 B1
(45) Date of Patent: Aug. 4, 2020

(54) ELECTRONIC DEVICE CONNECTION SYSTEM

(71) Applicants: HONG FU JIN PRECISION INDUSTRY (WuHan) CO., LTD., Wuhan (CN); HON HAI PRECISION INDUSTRY CO., LTD., New Taipei (TW)

(72) Inventors: Ching-Jou Chen, New Taipei (TW); Tzu-Wei Lai, New Taipei (TW)

(73) Assignees: HONG FU JIN PRECISION INDUSTRY (WuHan) CO., LTD., Wuhan (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 16/397,509

(22) Filed: Apr. 29, 2019

(30) Foreign Application Priority Data

Mar. 27, 2019 (CN) .......................... 2019 1 0240051

(51) Int. Cl.
| | |
|---|---|
| *H01R 13/74* | (2006.01) |
| *H01R 12/73* | (2011.01) |
| *H01R 13/516* | (2006.01) |
| *H05K 5/02* | (2006.01) |
| *H05K 5/00* | (2006.01) |
| *H01R 107/00* | (2006.01) |
| *H01R 24/60* | (2011.01) |

(52) U.S. Cl.
CPC ........... *H01R 13/743* (2013.01); *H01R 12/73* (2013.01); *H01R 13/516* (2013.01); *H05K 5/0021* (2013.01); *H05K 5/0065* (2013.01); *H05K 5/0247* (2013.01); *H01R 24/60* (2013.01); *H01R 2107/00* (2013.01)

(58) Field of Classification Search
CPC ...... H01R 12/73; H01R 13/46; H01R 13/514; H01R 13/516; H01R 13/5208; H01R 13/56; H01R 13/582; H01R 13/5825; H01R 13/743; H05K 5/0065; H05K 5/0247

See application file for complete search history.

(56) References Cited

U.S. PATENT DOCUMENTS

| | | | | |
|---|---|---|---|---|
| 3,002,175 A | * | 9/1961 | Seymour | H01R 13/508 439/564 |
| 3,091,748 A | * | 5/1963 | Takes | H01R 13/631 439/248 |

(Continued)

*Primary Examiner* — Oscar C Jimenez
(74) *Attorney, Agent, or Firm* — ScienBiziP, P.C.

(57) ABSTRACT

An electronic device connection system includes a main electronic device and a peripheral electronic device. The main electronic device includes a first housing, a first fixing member, and a first interface. The peripheral electronic device includes a second housing, a second fixing member, and a second interface. The first fixing member is coupled to the first housing. The first fixing member defines a first through hole passing through opposite ends of the first fixing member. The first interface is received through the first through hole. The second fixing member is coupled to the second housing. The second fixing member and the first fixing member are configured to plug into each other. The second fixing member defines a second through hole passing through opposite ends of the second fixing member. The second interface is received through the second through hole to plug with and electrically couple to the first interface.

20 Claims, 3 Drawing Sheets

(56) References Cited

U.S. PATENT DOCUMENTS

| | | | | |
|---|---|---|---|---|
| 4,915,641 | A * | 4/1990 | Miskin | H01R 13/631 |
| | | | | 439/247 |
| 5,525,074 | A * | 6/1996 | Tsuji | H01R 13/743 |
| | | | | 439/555 |
| 2006/0099841 | A1* | 5/2006 | Coyle, Jr. | H01R 13/743 |
| | | | | 439/248 |
| 2009/0209116 | A1* | 8/2009 | Lopez | H01R 13/516 |
| | | | | 439/76.2 |
| 2010/0068945 | A1* | 3/2010 | Chou | H01R 13/514 |
| | | | | 439/701 |
| 2011/0186348 | A1* | 8/2011 | Liao | H05K 5/00 |
| | | | | 174/559 |
| 2012/0045175 | A1* | 2/2012 | Ordo | H01R 13/506 |
| | | | | 385/55 |
| 2013/0260586 | A1* | 10/2013 | Higuchi | H01R 13/5219 |
| | | | | 439/272 |
| 2014/0318602 | A1* | 10/2014 | Black | H01L 31/02013 |
| | | | | 136/251 |
| 2018/0277999 | A1* | 9/2018 | Hayes | H01R 27/02 |
| 2018/0351291 | A1* | 12/2018 | Imai | H01R 13/5833 |
| 2019/0115691 | A1* | 4/2019 | Johnson | H01R 13/64 |

\* cited by examiner

ELECTRONIC DEVICE CONNECTION SYSTEM

FIELD

The subject matter herein generally relates to electronic devices, and more particularly to an electronic device connection system.

BACKGROUND

Generally, an electronic device is connected to an external device by a connection line, such as a universal serial bus (USB) cable. However, the connection line can be easily lost. Another way of connecting to the external device is through a wireless communication module installed in the electronic device and in the external device. However, this method is more expensive and is susceptible to unstable connection due to poor network signals.

BRIEF DESCRIPTION OF THE DRAWINGS

Implementations of the present disclosure will now be described, by way of embodiments, with reference to the attached figures.

DETAILED DESCRIPTION

Figure 1:
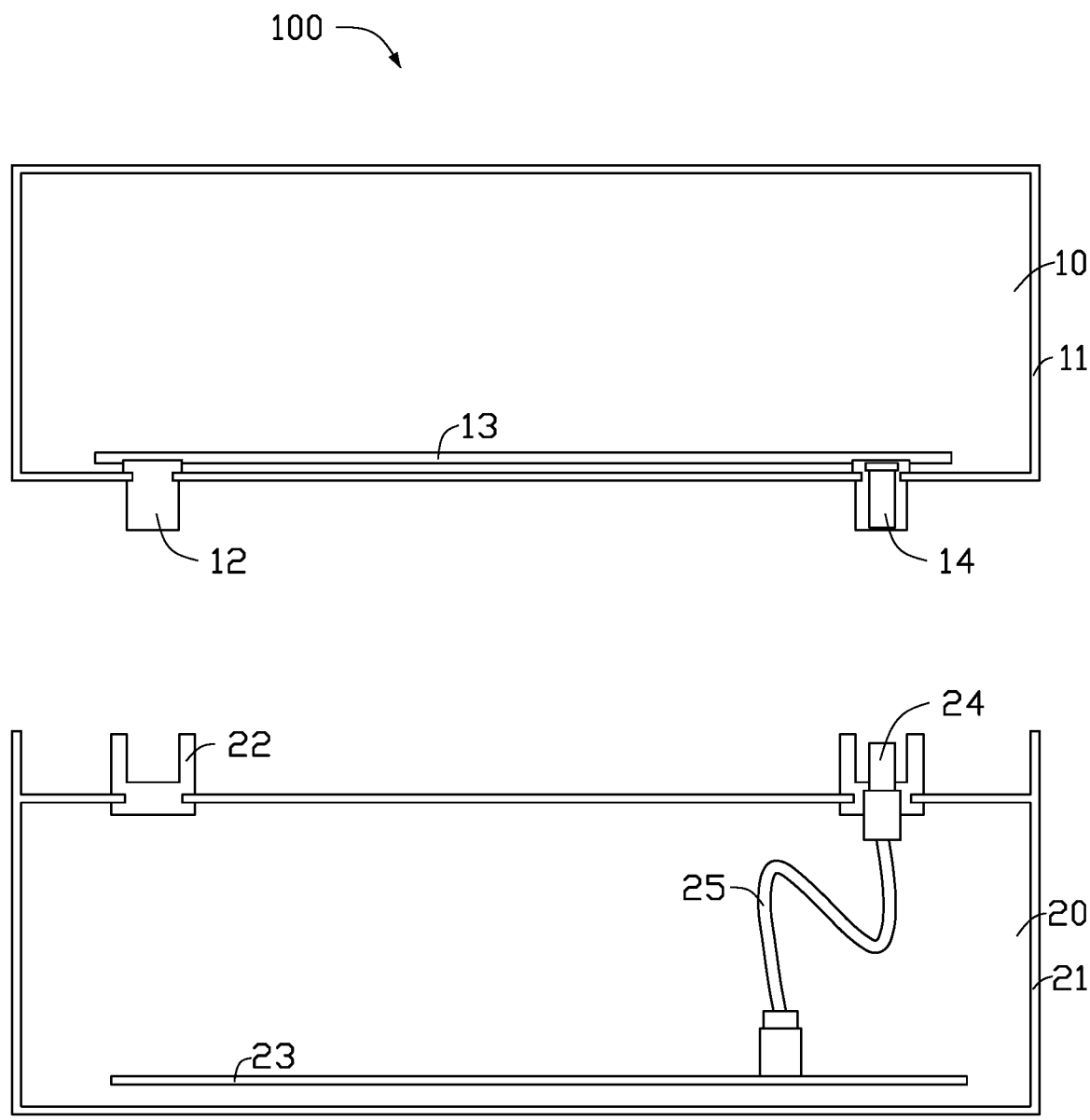
FIG. 1 is a diagram of an embodiment of an electronic device connection system including a main electronic device and a peripheral electronic device.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series and the like.

Figure 2:
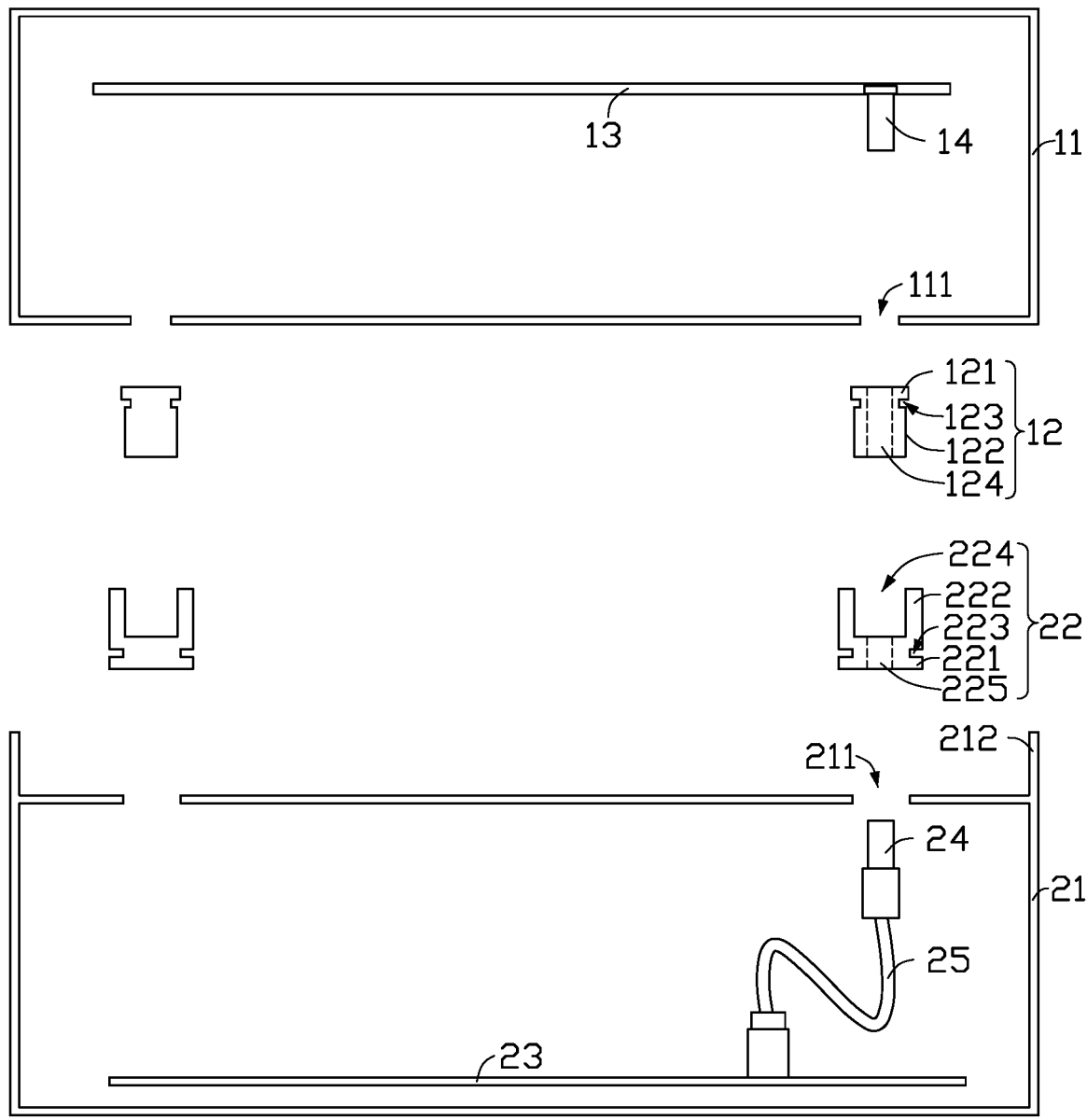
FIG. 2 is an exploded view of FIG. 1.
Figure 3:
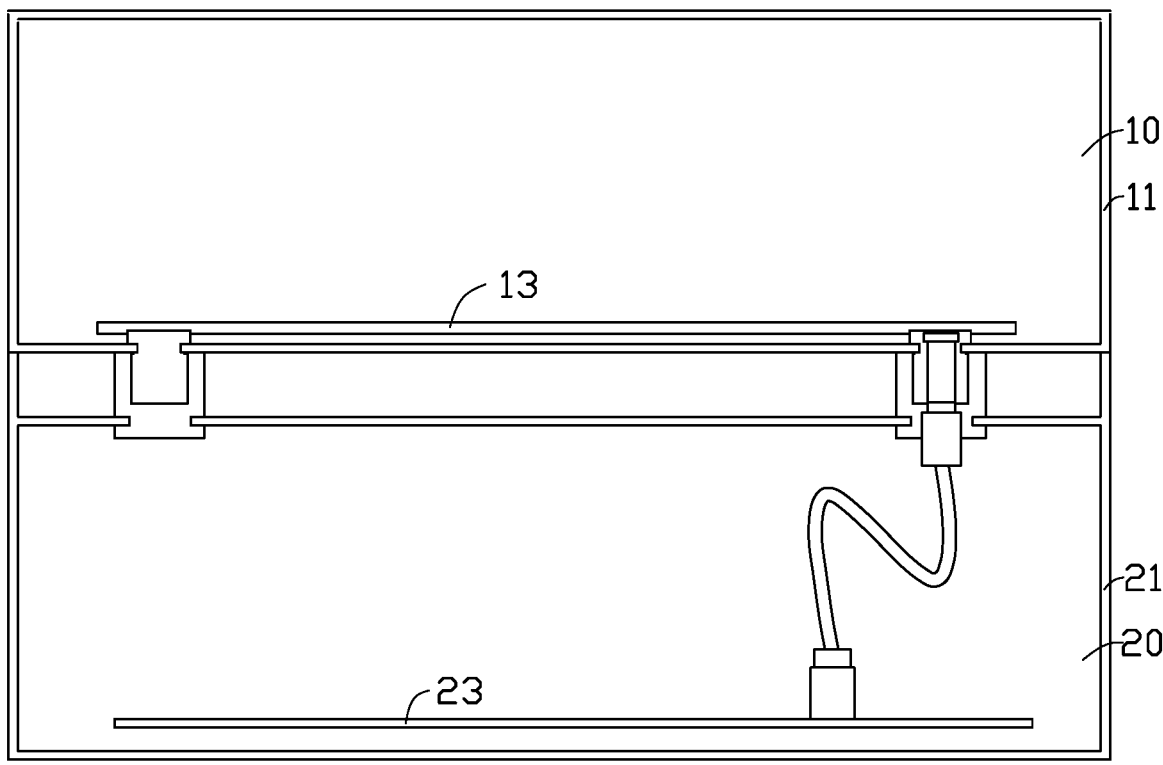
FIG. 3 is similar to FIG. 1, but showing the main electronic device coupled to the peripheral electronic device.

FIGS. 1 and 2 show an embodiment of an electronic device connection system 100. The electronic device connection system 100 includes a main electronic device 10 and a peripheral electronic device 20.

The main electronic device 10 includes a first housing 11 and a plurality of first fixing members 12. The plurality of first fixing members 12 are fixedly coupled to the first housing 11. The first housing 11 defines a plurality of through holes 111. A first abutting portion 121 and a first connecting portion 122 are respectively formed on two ends of the first fixing member 12, and a latching slot 123 is defined between the first abutting portion 121 and the first connecting portion 122. The latching slot 123 is defined for receiving an edge of the through hole 111 to latch the first fixing member 12 to the first housing 11. In this way, the first abutting portion 121 is received in the first housing 11, and the first connecting portion 122 protrudes from the first housing 11.

At least one of the first fixing members 12 defines a through hole 124. The through hole 124 extends through an end of the first abutting portion 121 and an end of the first connecting portion 122.

The main electronic device 10 further includes a first circuit board 13 and a first interface 14. The first interface 14 is fixedly mounted on the first circuit board 13 and is electrically coupled to the first circuit board 13. The first circuit board 13 is fixedly coupled to the first abutting portion 121, and the first interface 14 is received in the through hole 124.

The peripheral electronic device 20 includes a second housing 21 and a plurality of second fixing members 22. The plurality of second fixing members 22 are fixedly coupled to the second housing 21. The plurality of second fixing members 22 are detachably inserted into the first fixing members 12. The second housing 21 defines a plurality of through holes 211. A second abutting portion 221 and a second connecting portion 222 are respectively formed on two ends of the second fixing member 22. A latching slot 223 is defined between the second connecting portion 222 and the second abutting portion 221. The latching slot 223 is defined for receiving an edge of the through hole 211 to latch the second fixing member 22 to the second housing 21. In this way, the second abutting portion 221 is received in the first housing 11, and the second connecting portion 222 protrudes from the second housing 21. The second connecting portion 222 defines a receiving slot 224 for receiving the first connecting portion 122.

At least one of the second fixing members 22 defines a through hole 225. The through hole 225 extends through an end of the second abutting portion 221 and communicates with the receiving slot 224.

The peripheral electronic device 20 further includes a second circuit board 23 and a second interface 24. The second interface 24 is electrically coupled to the second circuit board 23. The second interface 24 is configured to be plugged into the first interface 14 to establish communication between the main electronic device 10 and the peripheral electronic device 20. The second circuit board 23 is fixedly mounted in the second housing 21. The second interface 24 is received in the receiving slot 224 through the through hole 225. In this way, when the first connecting portion 122 is inserted into the receiving slot 224, the first interface 14 is correspondingly inserted into the second interface 24, and the main electronic device 10 and the peripheral electronic device 20 are communicatively coupled.

The second interface 24 is electrically coupled to the second circuit board 23 via a connection cable 25.

In another embodiment, the second circuit board 23 can be fixedly coupled to the second abutting portion 221, so that the second interface 24 is fixedly mounted on the second circuit board 23 and electrically coupled to the second circuit board 23.

In one embodiment, the second housing 21 includes two limiting members 212 respectively protruding from two sidewalls of the second housing 21 toward the first housing 11. When the first fixing member 12 is inserted into the second fixing member 22, two sidewalls of the first housing 11 respectively abut against the limiting members 212. In this way, a contact force between the first fixing member 12 and the second fixing member 22 can be reduced, thereby increasing a service life of the electronic device connection system 100.

In one embodiment, the first interface 14 and the second interface 24 are universal serial bus (USB) Type-C interfaces.

In one embodiment, the first fixing member 12 and the second fixing member 22 are made of rubber, so that a connection and shock resistance of the electronic device connection system 100 can be improved. When the main electronic device 10 and the peripheral electronic device 20 are not coupled together, the first fixing member 12 and the second fixing member 22 can be used to support the main electronic device 10 and the peripheral electronic device 20, respectively.

In the electronic device connection system 100, the first interface 14 is disposed on the first fixing member 12, and the second interface 24 is disposed on the second fixing member 22. When the first fixing member 12 and the second fixing member 22 are coupled together, the first interface 14 interfaces with the second interface 24. In this way, a connection between the main electronic device 10 and the peripheral electronic device 20 is enhanced and stably established.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. An electronic device connection system comprising:
a main electronic device; and
a peripheral electronic device; wherein:
the main electronic device comprises a first housing, a first fixing member, and a first interface;
the first fixing member is fixedly coupled to the first housing;
the first fixing member defines a first through hole;
the first interface is received through the first through hole;
the peripheral electronic device comprises a second housing, a second fixing member, and a second interface;
the second fixing member is fixedly coupled to the second housing;
the second fixing member and the first fixing member are configured to plug into each other;
the second fixing member defines a second through hole;
the second interface is received through the second through hole to plug with and electrically couple to the first interface;
wherein the second housing comprises two limiting members respectively protruding from two sidewalls of the second housing toward the first housing; and wherein when the first fixing member is plugged into the second fixing member, two sidewalls of the first housing respectively abut against the limiting members thereby reducing a contact force between the first fixing member and the second fixing member.

2. The electronic device connection system of claim 1, wherein:
a first abutting portion and a first connecting portion are respectively formed on two ends of the first fixing member;
a first latching slot is defined between the first abutting portion and the first connecting portion;
the first through hole passes through an end of the first abutting portion and an end of the first connecting portion.

3. The electronic device connection system of claim 2, wherein:
the first housing defines a third through hole;
an edge of the third through hole is received in the first latching slot to latch the first fixing member to the first housing.

4. The electronic device connection system of claim 2, wherein:
the main electronic device comprises a first circuit board fixedly mounted to the first abutting portion;
the first interface is fixedly mounted and electrically coupled to the first circuit board.

5. The electronic device connection system of claim 2, wherein:
a second abutting portion and a second connecting portion are formed on two ends of the second fixing member;
a second latching slot is defined between the second abutting portion and the second connecting portion;
the second connecting portion defines a receiving slot for receiving the first connecting portion.

6. The electronic device connection system of claim 5, wherein:
the second housing defines a fourth through hole;
an edge of the fourth through hole is received in the second latching slot to latch the second fixing member to the second housing.

7. The electronic device connection system of claim 6, wherein:
the peripheral electronic device comprises a second circuit board and a connection cable;
the second circuit board is fixedly mounted in the second housing;
the second interface is electrically coupled to the second circuit board via the connection cable.

8. The electronic device connection system of claim 6, wherein:
the peripheral electronic device comprises a second circuit board fixedly mounted to the second abutting portion;
the second interface is fixedly mounted and electrically coupled to the second circuit board.

9. The electronic device connection system of claim 1, wherein:
the first interface and the second interface are universal serial bus Type-C interfaces.

10. The electronic device connection system of claim 1, wherein:
the first fixing member and the second fixing member are made of rubber.

11. An electronic device connection system comprising:
a main electronic device comprising a first housing, a first fixing member, and a first interface; and a peripheral electronic device comprising a second housing, a second fixing member, and a second interface; wherein:
the first fixing member is fixedly coupled to the first housing;
the first fixing member defines a first through hole passing through opposite ends of the first fixing member;
the first interface is received through the first through hole;
the second fixing member is fixedly coupled to the second housing;
the second fixing member and the first fixing member are configured to plug into each other;
the second fixing member defines a second through hole passing through opposite ends of the second fixing member;
the second interface is received through the second through hole to plug with and electrically couple to the first interface;
wherein the second housing comprises two limiting members respectively protruding from two sidewalls of the second housing toward the first housing; and wherein when the first fixing member is plugged into the second fixing member, two sidewalls of the first housing respectively abut against the limiting members thereby reducing a contact force between the first fixing member and the second fixing member.

12. The electronic device connection system of claim 11, wherein:
a first abutting portion and a first connecting portion are respectively formed on two ends of the first fixing member;
a first latching slot is defined between the first abutting portion and the first connecting portion;
the first through hole passes through an end of the first abutting portion and an end of the first connecting portion.

13. The electronic device of claim 12, wherein:
the first housing defines a third through hole;
an edge of the third through hole is received in the first latching slot to latch the first fixing member to the first housing.

14. The electronic device of claim 13, wherein:
the main electronic device comprises a first circuit board fixedly mounted to the first abutting portion;
the first interface is fixedly mounted and electrically coupled to the first circuit board.

15. The electronic device of claim 14, wherein:
a second abutting portion and a second connecting portion are formed on two ends of the second fixing member;
a second latching slot is defined between the second abutting portion and the second connecting portion;
the second connecting portion defines a receiving slot for receiving the first connecting portion;
the second through hole passes through an end of the second abutting portion and communicates with the receiving slot.

16. The electronic device of claim 15, wherein:
the second housing defines a fourth through hole;
an edge of the fourth through hole is received in the second latching slot to latch the second fixing member to the second housing.

17. The electronic device of claim 16, wherein:
the peripheral electronic device comprises a second circuit board and a connection cable;
the second circuit board is fixedly mounted in the second housing;
the second interface is electrically coupled to the second circuit board via the connection cable.

18. The electronic device of claim 16, wherein:
the peripheral electronic device comprises a second circuit board fixedly mounted to the second abutting portion;
the second interface is fixedly mounted and electrically coupled to the second circuit board.

19. The electronic device of claim 11, wherein:
the first interface and the second interface are universal serial bus Type-C interfaces.

20. The electronic device of claim 11, wherein:
the first fixing member and the second fixing member are made of rubber.

* * * * *